United States Patent [19]

Blackwood

[11] 4,286,541
[45] Sep. 1, 1981

[54] APPLYING PHOTORESIST ONTO SILICON WAFERS

[75] Inventor: Robert S. Blackwood, Chanhassen, Minn.

[73] Assignee: FSI Corporation, Chaska, Minn.

[21] Appl. No.: 60,973

[22] Filed: Jul. 26, 1979

[51] Int. Cl.³ .................. B05C 5/00; B05C 11/06; B05C 11/08; B05C 13/02
[52] U.S. Cl. ........................ 118/52; 118/63; 118/320; 118/500; 134/102; 134/153; 354/325
[58] Field of Search .................. 118/52, 63, 320, 321, 118/313, 500; 239/284 R; 134/102, 153; 354/323, 325

[56] References Cited

U.S. PATENT DOCUMENTS

| 2,069,844 | 2/1937 | Paasche | 118/320 X |
|---|---|---|---|
| 3,169,676 | 2/1965 | Hanselmann | 239/284 R X |
| 3,489,608 | 1/1970 | Jacobs et al. | 134/149 X |
| 3,604,331 | 9/1971 | Carberry et al. | 354/324 |
| 3,769,992 | 11/1973 | Wallestad | 134/153 X |
| 3,812,514 | 5/1974 | Watabe | 354/325 X |
| 3,846,818 | 11/1974 | Merz | 354/324 |
| 3,911,460 | 10/1975 | Lasky | 354/328 |
| 3,923,156 | 12/1975 | Wallestad | 206/454 |
| 3,961,877 | 6/1976 | Johnson | 432/253 |
| 3,973,847 | 8/1976 | Gygax et al. | 354/325 X |
| 3,974,797 | 8/1976 | Hutson | 118/320 X |
| 3,990,088 | 11/1976 | Takita | 354/324 X |
| 3,990,462 | 11/1976 | Elftmann et al. | 134/200 X |
| 4,027,686 | 6/1977 | Shortes et al. | 134/153 X |
| 4,081,816 | 3/1978 | Geyken et al. | 354/324 |
| 4,197,000 | 4/1950 | Blackwood | 354/323 |

Primary Examiner—John P. McIntosh
Attorney, Agent, or Firm—H. Dale Palmatier

[57] ABSTRACT

Applying photoresist to silicon wafers in the manufacture of integrated circuit chips by carrying the wafers upon a rotor in a chamber and spraying from a plurality of nozzles in the chamber toward the rotor for application to the wafers.

3 Claims, 3 Drawing Figures

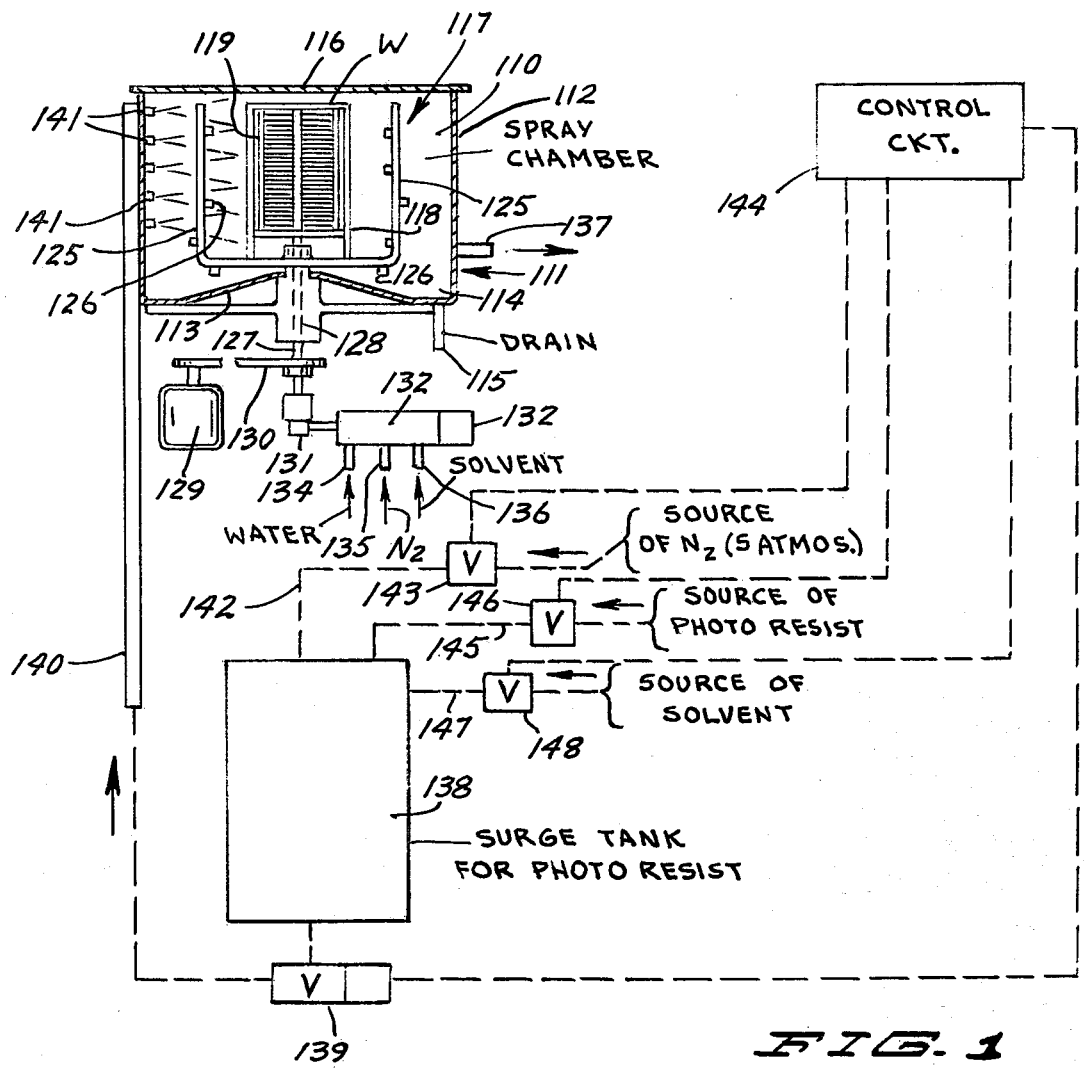
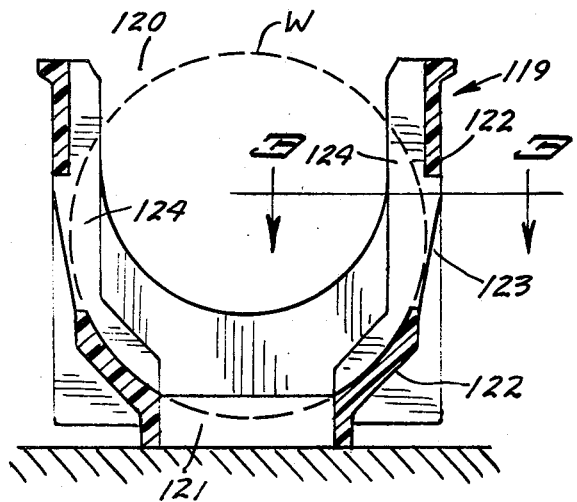
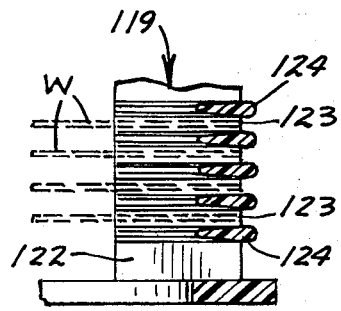

APPLYING PHOTORESIST ONTO SILICON WAFERS

This invention relates to apparatus for and method of applying photoresist onto silicon wafers in the processing of such wafers during manufacture of integrated circuit chips.

BACKGROUND OF THE INVENTION

Photoresist has been applied to silicon wafers in the process of the manufacture of integrated circuit chips, in a number of different ways, and various types of apparatus have been used. In general, photoresist has been applied to such wafers in four different methods. It has been common to lay a wafer on a stationary or revolving surface so as to expose the top of the wafer, and in instances where the wafer is held stationary, the photoresist is applied to the top surface of the wafer by spraying or by applying with a roller. In other instances where the wafer is revolving with the support for it, a few drops or a small stream of photoresist is applied to the center of the revolving wafer, adjacent the rotation axis, and the photoresist is spread by centrifugal force across the face of the wafer. In other instances, wafers have been dipped into a bath of photoresist for applying such photoresist to the surface of the wafer.

It will be recognized that the applying of photoresist in any of these prior methods is slow and time consuming, and there is a very substantial wastage of the photoresist. In most instances, the excess photoresist is removed from the wafer, but the wastage of the photoresist amounts to about twenty times the quantity of photoresist as remains on the face of the wafer after the process is completed.

SUMMARY OF THE INVENTION

An object of this invention is to provide improved apparatus for and a method of applying photoresist to silicon wafers in the manufacturing of integrated circuit chips.

Another object of the invention is to provide for the application of photoresist to a multiplicity of such wafers simultaneously and to minimize wastage of such photoresist.

Still another object of the invention is to provide for the simultaneous application of photoresist to both sides of each of a multiplicity of such silicon wafers in the manufacturing of integrated circuit chips.

A principal feature of the present invention is the accumulating of a multiplicity of such silicon wafers in spaced face to face relation with each other on a revolving rotor in a closed chamber. The wafers on the rotor are confined to lie transversely of and substantially concentric of the rotation axis. The photoresist is supplied through an upright manifold pipe extending along the rotor and to a number of stationary nozzles, which are spaced from each other and which direct the photoresist under significant force toward the spaced wafers on the rotation axis and toward the vertical axis of rotation. The photoresist is thereby simultaneously applied to both sides of a multiplicity of such wafers. Subsequently, the rotor speed is significantly increased as to centrifuge excess photoresist from the wafers.

The photoresist is supplied to the nozzles very suddenly and under substantial pressure, on the order of five to seven atmospheres. The photoresist fairly explodes from the nozzle and substantially equal quantities are discharged from each of the nozzles in spite of the vertically spaced relation of the nozzles along the manifold pipe.

The very significant pressure on the photoresist is produced by storing a measured quantity of the photoresist in a surge tank which is connected to the manifold pipe and nozzles. Pressure is suddenly applied by introducing nitrogen gas under five to seven atmospheres of pressure into the surge tank, whereupon the photoresist is very rapidly expelled from the tank and out through the nozzles onto the wafers in the chamber.

Several significant advantages are obtained through the present invention. Firstly, a multiplicity of wafers are simultaneously coated with photoresist without substantial wastage of the photoresist. Both sides of each of the wafers are similarly coated with the photoresist.

The nozzle and manifold system through which the photoresist is supplied into the chamber for spraying onto the wafers, is essentially self-cleaning because of the temporary storage of the quantity of photoresist in a surge tank, followed by application of the high pressure nitrogen gas into the tank which causes the entire quantity of photoresist in the tank to be discharged through the manifold pipe and nozzles. In the process, the manifold pipe and nozzles are blown completely clear of the photoresist during each cycle of operation. In addition, the high pressure nitrogen gas used to propel the photoresist and clean out the manifold pipe and nozzles also has the effect of blowing off excess photoresist from the wafers before the high speed centrifuging of the wafers is commenced. It has been determined that, although the quantity of photoresist remaining on the wafers is fully adequate for the purpose intended, in an amount of one-half to one cubic centimeters of photoresist on each wafer, the total amount of photoresist actually applied is very significantly reduced as compared to the amounts applied through prior art methods. According to the present invention, only five to seven cubic centimeters of photoresist is supplied per wafer in the chamber.

BRIEF DESCRIPTION OF THE DRAWINGS

FIG. 1 is a somewhat diagrammatic sketch illustrating the present invention.

FIG. 2 is an enlarged detail section view illustrating a typical carrier which may be mounted on the rotor.

FIG. 3 is an enlarged detail section view taken approximately at 3—3 in FIG. 2.

DETAILED SPECIFICATION

The present invention relates to the application of photoresist to wafers W which are usually silicon wafers of the type that are extremely thin and brittle in nature and therefore very delicate to handle. Such wafers may be 50/1000ths inch in thickness, but frequently are as thin as 10 to 20/1000ths. The wafers are commonly three to four inches in diameter, but have been made in larger sizes also. The wafers will be processed in the spray chamber 110 of a bowl-shaped housing 111 having a substantially cylindrical sidewall 112, a generally conically-shaped bottom 113 to define an outer peripheral sump area 114 in the housing to which a drainpipe 115 is connected. The housing also has a removable cover 116 so as to entirely close the interior chamber 110.

A rotor 117 in the chamber has a skeletal framework 118 which confines a carrier or basket 119 in which a multiplicity of wafers W are confined.

The carrier 119 is molded from plastic and may be molded from polytetrafluoroethylene, also known by its trademark TEFLON. The carrier has an open top 120 and an open bottom 121, a sidewall 122 with a multiplicity of slots 123 therein to provide open access to the wafers confined therein. The wafers are maintained in spaced face to face relation with each other by a multiplicity of spacer ribs 124 to allow access to the opposite sides of each of the wafers confined in the carrier. The carrier 119 is confined in the skeletal frame 118 so that the wafers W are located substantially concentric of the rotation axis of the rotor 117.

The rotor also includes revolving manifold pipes 125 with spray nozzles 126 thereon spraying in multiple directions, as needed. The rotor is supported on a hollow shaft 127 affixed to the skeletal frame 118 and to the manifold pipes 125, and mounted in a bearing structure 128 which is part of the supporting framework of the housing 111. The shaft 127 is driven by motor 129 through a pulley and belt drive 130. The lower end of the shaft 127 is connected through an end bearing and hydraulic fitting 131 to a multi-position valve 132 with an operating solenoid 133 so that any of several inputs may be connected to the hollow shaft 127 from the input ducts 134, 135, and 136, so that any of a number of different fluids, including water, nitrogen gas, and liquid solvent can be sprayed from the nozzles 126.

An atmosphere exhaust duct 137 is also provided on the housing 112 for connection to an exhaust system for withdrawing the gaseous fluids from the spray chamber 110. Typically the cylindrical housing 111 is approximately twelve inches in diamter for applying photoresist to wafers which may be three to four inches in diameter.

A tank 138 for measuring a supply of photoresist may have an approximate capacity of 200 milliliters which should be sufficient to supply photoresist for coating an entire carrier load of wafers W which may be approximately twenty-five wafers. The tank 138 is entirely closed and has a bottom outlet connected through a solenoid valve 139 into a manifold pipe 140 which lies against the exterior face of the cylindrical sidewall 112 of the housing 111. The manifold pipe 140 has a multiplicity of spray nozzles 141 mounted thereon and projecting into the interior of the spray chamber 110, and through the cylindrical sidewall 112. It will be recognized that the nozzles 141 are disposed in substantial alignment, generally parallel to the rotation axis of the rotor 117 and adjacent the periphery of the rotor. The nozzles 141 are oriented in the spray chamber so as to direct their sprays toward the wafers W in the carrier 119 and toward the rotation axis of the rotor.

The surge tank 138 is connected at its top by a fluid duct 142 to a valve 143 for connecting the tank to a source of nitrogen gas under significant pressure, in the range of five to seven atmospheres. It has been proven satisfactory to use the nitrogen gas in the range of 75 psi, but the pressure of the gas has also been found to be satisfactory at approximately 100 psi. Operating the gas valve 143 is controlled by a control circuit 144 which controls the sequence of the several valves. Another flow line or duct 145 connected to the top of tank 138 is connected through valve 146 to a source of photoresist for replenishing the supply of photoresist in the tank 138. The photoresist dispensing valve 146 is also controlled from the control circuitry 144. Although the filling of the photoresist tank 138 may be quantity-responsive, operating in response to a float valve, it is preferred, according to the present invention, to control the valve 146 on the basis of time during which the valve is opened, whereupon the tank 138 will be filled to the proper level. Another inlet duct 147 is connected to the tank 138 and is connected through a valve 148 to a source of solvent for cleaning the interior of the tank and cleaning the interior of valve 139, manifold duct 140, nozzles 141, and the interior of the housing 111 after the wafers have been removed. Operation of valve 148 is controlled from the control circuit 144 and may be manually controlled. In addition, the valve 139 is also controlled from the control circuit 144 so as to make sure that the connection between the surge tank 138 and manifold pipe 140 is open prior to applying the high pressure nitrogen gas to the tank.

It should be recognized that the photoresist is fairly heavy and thick in nature, but will vary some, depending upon formulation; and usually, the photoresist will vary in consistency from the viscosity of motor oil to that of honey.

When the surge tank 138 is essentially filled with photoresist, the control circuit will open the valve 139 and subsequently open the gas valve 143 for the purpose of suddenly applying the high pressure nitrogen gas to the tank 138. Because the gas has a pressure in the range of five to seven atmospheres, the buildup of rate of flow of the photoresist through the manifold pipe 140 and through the nozzles 141 is very significant, and, although the nozzles 141 are spaced from each other in a verical direction, there is practically no lag between the arrival of the photoresist at the several nozzles, nor is there any difference of the pressure applied to the photoresist at the several nozzles; and, as a result, there is a substantially uniform spray of photoresist from all of the nozzles directed toward the rotation axis of the rotor and toward all of the wafers W thereon. The very significant level of pressure on the photoresist caused by the nitrogen gas causes the photoresist to seemingly explode from the nozzles 141 so that the photoresist is applied to the wafers in a very short period of time.

Approximately five to seven cubic centimeters of photoresist is applied onto each wafer. Of course, the sprayed photoresist enters through the open top or open bottom of the carrier 119 or through the side slots 123 so that each of the wafers is thoroughly covered on both sides with photoresist. During the time when photoresist is being sprayed from the nozzles, the motor 129 drives the rotor 117 at a relatively low rate of speed, in the range of 25 to 100 rpm.

After the quantity of photoresist in tank 138 has been entirely exhausted, the application of nitrogen gas from the source is continued for a few moments to entirely blow the photoresist out of the valve 139 and manifold pipe 140 and nozzles 141. The nitrogen gas blown from the nozzles 141 helps to start removing the excess photoresist from the faces of the wafers W. After the completion of application of photoresist to the wafers, the motor 129 immediately is accelerated to revolve the rotor 117 at a much higher speed, in the range of 1000 to 2000 rpm, depending upon the specific nature of and the viscosity of the photoresist being used. Excess photoresist is slung or centrifuged off the wafers, and after the excess photoresist has been slung from the wafers, approximately one-half to one cubic centimeter of photoresist remains on each wafer.

Also, after the photoresist in tank 138 has been exhausted, and after a few moments of blowing of nitrogen gas through the nozzles 141, the control circuitry 144 will close the valve 143 and will thereafter close valve 139 and reopen the valve 146 for applying more photoresist into the tank 138. The valve 146 will stay open so long as it is required to fill the tank 138 with the necessary quantity of photoresist for the next cycle of operation. Subsequently, the rotor is stopped, and the carrier 119 filled with wafers W is entirely removed from the spray chamber 110 after the cover 116 is opened.

Another carrier may be placed on the rotor and its wafers will also be disposed substantially concentric of the rotation axis and in spaced face to face relation along the axis. Occasionally, if any buildup of the photoresist in the interior of the spray chamber is noted, a quantity of solvent can be supplied into the tank 138 while empty and subsequently blown through the manifold pipe and nozzles as to completely clean the interior of the spray chamber together with the rotor. Additionally, solvent may be supplied through the valve 132 and through the manifold pipes 125 and nozzles 126 for more thorough cleaning of the entire interior of the spray chamber.

It will be seen that the invention provides apparatus and method of applying photoresist to a multiplicity of silicon wafers simultaneously wherein the wafers are spaced from each other in face to face relation along the rotation axis of a rotor in an enclosed chamber, and the photoresist is sprayed toward the rotation axis under high pressure from a plurality of nozzles oriented in a vertically oriented row so that both sides of each of the wafers is simultaneously coated with the photoresist. While the photoresist is being applied to the wafers, the rotor and the wafers are revolving rather slowly, but after spraying is completed, the rotor is accelerated to high speeds as to centrifuge or sling the excess photoresist from the wafers.

What is claimed is:

1. Apparatus for applying photoresist to silicon wafers in the manufacture of integrated circuit chips, comprising enclosure means defining a closed chamber, the enclosure means including elongate peripheral walls and end walls traversing the peripheral walls and enclosing the chamber, an upright rotor in the chamber and revolving about an upright rotation axis extending transversely through the end walls, the rotor having elongate molded plastic carrier means with vertically spaced wafer edge supports for supporting such silicon wafers to lie transversely of the rotation axis in spaced and confronting relation to each other along and substantially concentric of the rotation axis, the carrier means having unobstructed openings at the sides thereof and extending vertically along significant portions of the length of the peripheral walls, each of the openings having a vertical length in excess of the vertical spacing between a plurality of the wafer edge supports and the spaces therebetween and each of the openings having a horizontal width of the same order of magnitude as the horizontal spacing between adjacent wafer edge supports to provide ready access to the wafers carried on the supports, and plurality of vertically spaced and horizontally directed nozzles in the chamber and adjacent the rotor, the nozzles being arranged in an upright row oriented endwise of the rotor, and being directed toward the rotor and rotation axis, and confronting the openings at the sides of the enclosure means to spray directly across and onto the wafers on the rotor, and a supply of photoresist connected to the nozzles for spraying onto the wafers, and the supply of photoresist including a closed measuring tank, and a valved source of high pressure gas under a continuing plurality of atmospheres of pressure and connected to the tank, the valved source being open and applying the continuing plurality of atmospheres to blow the entire measured quantity of photoresist from the tank and through the nozzles for application to the wafers, the high pressure on the gas being significant and substantially in excess of the small variations in pressure in the liquid photoresist at the nozzles caused by the vertical spacing of the nozzles whereby to equalize the quantity of photoresist sprayed from the several nozzles onto various silicon wafers.

2. The apparatus according to claim 1 and the high pressure gas comprising nitrogen.

3. The apparatus according to claim 1 and the gas in the valved source having a continuing pressure on the order of five atmospheres.

* * * * *